United States Patent [19]
Haque

[11] 4,315,223
[45] Feb. 9, 1982

[54] CMOS OPERATIONAL AMPLIFIER WITH IMPROVED FREQUENCY COMPENSATION

[75] Inventor: Yusuf A. Haque, Santa Clara, Calif.

[73] Assignee: American Microsystems, Inc., Santa Clara, Calif.

[21] Appl. No.: 79,341

[22] Filed: Sep. 27, 1979

[51] Int. Cl.³ .............................................. H03F 3/45
[52] U.S. Cl. .................................. 330/253; 330/260
[58] Field of Search ............... 330/252, 253, 260, 294, 330/302, 307

[56] References Cited

U.S. PATENT DOCUMENTS 3,622,900  11/1971  Hanus et al. ...................... 330/260
4,213,098  7/1980  Tsividis ............................. 330/253

OTHER PUBLICATIONS

Maidique, "A High-Precision Monolithic Super-Beta Operational Amplifier", *IEEE Journal of Solid-State Circuits*, vol. SC-7, No. 6, Dec. 1972, pp. 480–487.
Long, "Monolithic Analog Circuits", *1973 IEEE International Solid-State Circuits Conference*, Feb. 16, 1973, pp. 178, 179, 221, 222.

*Primary Examiner*—James B. Mullins
*Attorney, Agent, or Firm*—Skjerven, Morrill, Jensen, MacPherson & Drucker

[57] ABSTRACT

An operational amplifier circuit comprised of complementary MOS transistors and having a bias section, a differential amplifier section, a level shift stage and an output stage, provides for frequency compensation using two capacitors. One capacitor, connected between the differential amplifier section and the output stage through a CMOS transmission gate that functions as a resistor, acts as the dominant pole of the transfer function. A second capacitor between the amplifier section output node and a level shift transistor, functions to remove the secondary poles in the transfer function and cause the dominant pole to occur at a higher frequency.

3 Claims, 1 Drawing Figure

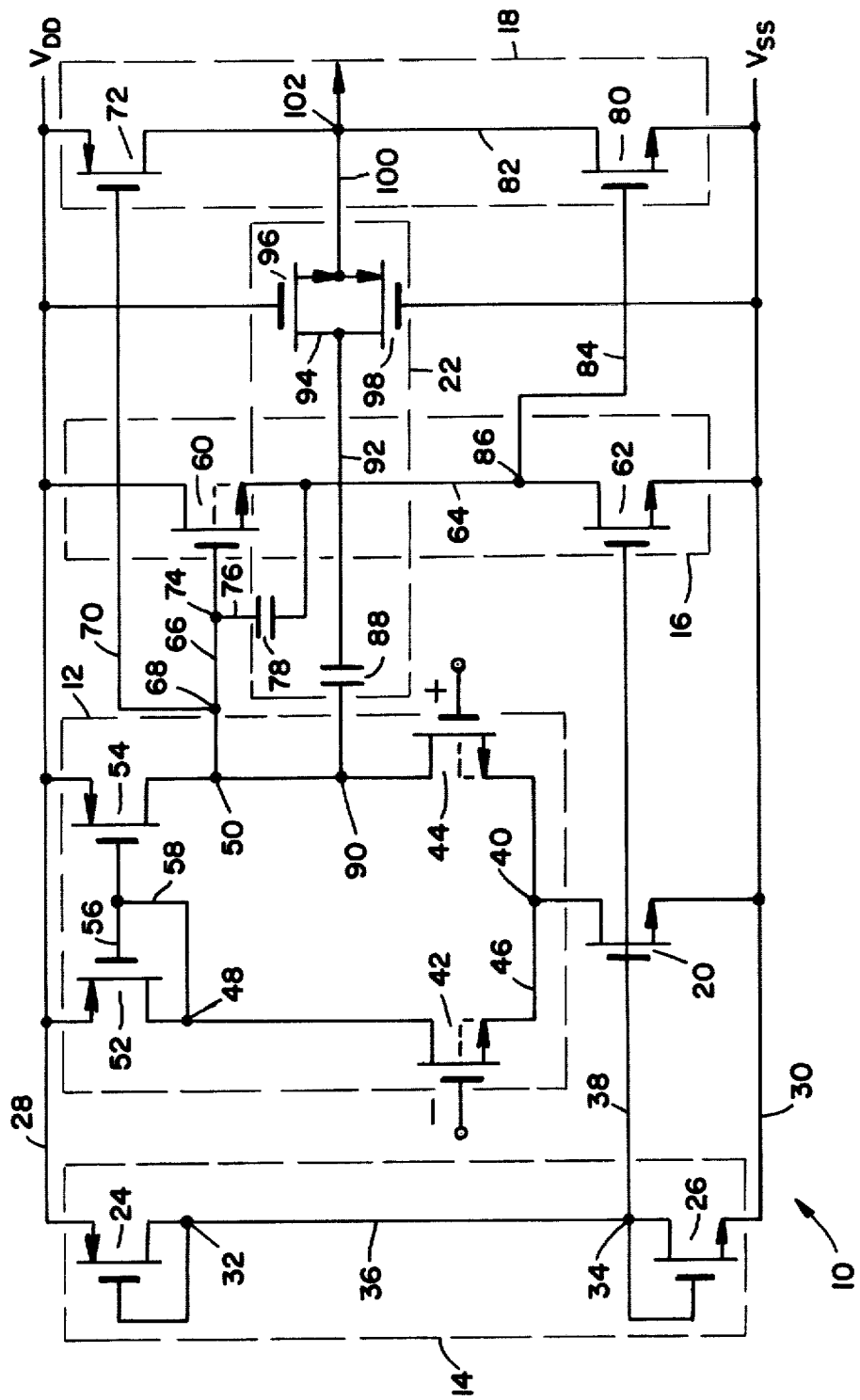

CMOS OPERATIONAL AMPLIFIER WITH IMPROVED FREQUENCY COMPENSATION

BACKGROUND OF THE INVENTION

This invention relates to operational amplifier circuits employing complementary metal-oxide-semiconductor transistors and more particularly, to such circuits having improved frequency compensation.

In order to assure operational stability for an operational amplifier having multi-gain stages, the phase shift at its output, under open loop conditions, should not exceed 180°. To achieve this, the operational amplifier must be internally compensated.

One prior method for providing such compensation, was to use a compensating capacitor ($C_c$) in the lead between the output and input of the operational amplifier. However, this arrangement resulted in the creation of a transfer function zero at ($gm/C_c$) (where gm is the transconductance factor for the circuit) in the frequency domain by virtue of direct feed forward. For MOS circuits, this zero is located within the bandwidth of interest and decreases the output phase shift. At the same time, it prevents the output magnitude from rolling off and can cause instability in the amplifier. One prior scheme for solving this problem involved the use of a noninverting buffer amplifier in the feedback path, which served to avoid feed forward effects that originally created the zero. This approach is described in the IEEE Journal of Solid State Circuits, Vol. SC-11, pp. 748-753. However, a disadvantage with this scheme was that the buffer amplifier consumed significant and excessive amounts of power. Another approach to solving this problem, was to reduce the value of the compensating capacitor ($C_c$). The effect of this approach is to shift the frequency of the transfer function zero to a higher frequency outside the region of interest for the particular operational amplifier. This scheme would appear to be reasonable for operational amplifiers having high open loop gain, such as CMOS operational amplifiers. However, the drawback of this technique is that high frequency power supply noise rejection is poor. This is due to the fact that at low frequencies, any noise on the ground power conductor is not amplified by the input element of the output stage. However, with increasing frequency, the capacitor $C_c$ creates a smaller impedance between internal nodes which creates an increased gate to source voltage on the input elements and results in decreased power supply noise rejection.

It is therefore one object of the present invention to solve the problem of providing for effective internal frequency compensation in CMOS operational amplifiers.

Another object of the invention is to provide an improved CMOS operational amplifier circuit with adequate frequency compensation and reduced power dissipation.

Another object of the invention is to provide a CMOS operational amplifier circuit that improves the power supply noise rejection ratio of the amplifier.

Still another object of the present invention is to provide a CMOS operational amplifier particularly well adapted for use in large scale integrated circuit devices.

Another object of the invention is to provide an increased gain bandwidth product for the operational amplifier.

SUMMARY OF THE INVENTION

In accordance with principles of the present invention, frequency compensation in an operational amplifier is achieved by the combination of a pair of capacitors and a transmission gate comprised of two MOS transistors acting as a resistor. One capacitor is Miller multiplied by the open loop gain of the amplifier and is the dominant pole in the amplifier. The time constant of this capacitor and the two MOS devices is used to shift the position of the right half plane zero (that is created if the MOS devices of the transmission gate are not present) to a left half plane zero and placed advantageously. The second capacitor is used in the compensation scheme to improve the gain bandwidth product of the amplifier and to improve the power supply noise rejection of the amplifier. This second capacitor uses pole zero cancellation to broadband the level shift stage, and thus by removing secondary poles, allows the dominant pole position to be shifted to a higher frequency by making the first capacitor smaller. This increases the gain bandwidth product. The power supply noise rejection of the operational amplifier is also dependent on the location of the dominant pole and improves as the pole's location is changed to a higher frequency.

Other objects, advantages and features of the invention will become apparent from the following detailed description of one preferred embodiment thereof, presented in conjunction with the accompanying drawing.

BRIEF DESCRIPTION OF THE DRAWING

The FIGURE shown is a circuit diagram of an operational amplifier embodying principles of the present invention.

DETAILED DESCRIPTION OF INVENTION EMBODIMENT

With reference to the drawing, FIG. 1 shows the circuit diagram of an operational amplifier 10 embodying principles of the present invention and comprised of MOSFET elements. In general, the operational amplifier is comprised of a differential amplifier 12, connected to a biasing network 14, and an intermediate level shift stage 16, connected to an output stage 18. The differential amplifier typically includes an input stage connected to a constant current source 20. Connected between the differential amplifier 12 and the output stage 18 is a frequency compensating means 22 according to the invention.

All of the transistor elements of the various components of the operational amplifier 10 are MOSFET devices and for proper operation of the operational amplifier circuit these devices (except transistors 96 and 98 of a transmission gate which will be described later), must operate in the saturation mode as opposed to the linear mode. The function of the bias network 14 is to assure that the circuit MOSFET devices (except devices 96 and 98) operate in the proper saturation region, and it comprises two MOSFET devices 24 and 26, each having source, drain and gate electrodes. The source electrode of transistor 24 is connected to a positive voltage supply $V_{DD}$ via a power lead 28 and the source of transistor 26 is connected by a lead 30 to a negative power supply $V_{SS}$. The drain and gate electrodes of transistor 24 are connected to a node 32 and the drain and gate electrodes of transistor 26 are connected to a node 34. These nodes 32 and 34 are interconnected by a lead 36, and a lead 38 from the node 34 provides the biasing voltage for both the constant current source and the level shift section of the circuit.

The constant current source 20 comprises a MOSFET device whose gate is connected to the biasing voltage lead 38. The source of this transistor is connected to the negative power lead 30 and its drain is connected to the input stage of the differential amplifier.

This input stage comprises a pair of MOSFET devices, 42 and 44, whose respective source electrodes are connected to a common lead 46 which is also connected from a node 40 to the drain of transistor 20. A drain electrode of the device 42 is connected to a node 48 of the differential amplifier and the drain electrode of device 44 is connected to a node 50 of the differential amplifier. The gate of input device 42 is connected to a negative input terminal of the operational amplifier and the gate of device 44 is connected to its positive input terminal.

The load section of the differential amplifier 12 comprises a pair of MOSFET devices 52 and 54 whose source terminals are both connected to the positive power lead 28. The gates of these devices are interconnected by a lead 56 which is also connected by a lead 58 to the node 48.

The intermediate level shift stage 16 of the operational amplifier 10 comprises a pair of MOSFET devices 60 and 62 connected in series between the positive and negative power leads. The drain of device 60 is connected to the positive power lead 28, and the source of device 62 is connected to the negative power lead 30.

The source of device 60 is connected by a lead 64 to the drain of device 62. The gate of device 60 is connected by a lead 66 from the node 50. A first node 68 in the lead 66 is connected by a lead 70 to the gate of a MOSFET device 72 in the output stage 18 of the operational amplifier 10. A second node 74 in the lead 66 is connected by a lead 76 to one side of a capacitor 78 whose other side is connected to the lead 64.

The output stage 18 comprises the MOSFET device 72 whose source is connected to the positive power lead 28 and a second MOSFET device 80 whose source is connected to the negative power lead 30. The drain electrodes of these two transistors are interconnected by a common lead 82. The gate of MOSFET 80 is connected by a lead 84 to a node 86 in the lead 64 between the devices 60 and 62.

The frequency compensation means 22, according to the present invention, is provided between the differential amplifier section 12 and the output stage 18. It comprises the capacitor 78 between leads 64 and 66 and also a capacitor 88 having one side connected to a node 90 in the output side of the differential amplifier 12. The other side of this capacitor 88 is connected by a lead 92 to an interconnection lead 94 between the drain electrodes of two MOSFET devices 96 and 98 whose sources are both connected to one end of a lead 100, the other end of lead 100 terminates at an output node 102 for the operational amplifier 10 in the lead 82. The gate of MOSFET 96 is connected to power lead 28 and the gate of MOSFET 98 is connected to lead 30.

The operation of operational amplifier 10 with its frequency compensation means may be described as follows: The transistors 96 and 98 form a transmission gate which functions as a resistor. The capacitor 88 in lead 92 is Miller multiplied by the open loop gain of the operational amplifier and acts as the dominant pole in its transfer function. In the absence of transistors 96 and 98, direct connection of capacitor 88 to the output 102 would have created a right half plane zero. However, by using transistors 96 and 98, the right half plane zero is converted into a left half plane zero and is advantageously placed to cancel secondary poles in the open loop frequency response.

The capacitor 78 functions to broadband the level shift stage consisting of transistors 60 and 62. This is achieved by allowing the zero created by capacitor 78 to cancel the pole created by the gate capacitance of transistor 60. By removing the secondary poles in the operational amplifier's transfer function, the location of the dominant pole is allowed to be situated at a higher frequency, thus increasing the gain bandwidth product of the amplifier.

The invention also serves to improve the power supply noise rejection of the amplifier. At low frequencies, any noise on $V_{DD}$ is not amplified by the output stage transistor 72 since its $V_{gs}$ is small. (Since the differential amplifier output node 90 is a high impedance point, any supply noise also appears on it.) However, with increasing frequency, capacitor 88 creates a smaller impedance between node 102 and node 90. Thus, all of the power supply noise does not appear on node 102 and this creates a finite $V_{gs}$ for transistor 72. This is amplified by the output state transistors 72 and 80 and results in decreased power supply noise rejection. In the present invention, the use of first capacitor 78 allows the second capacitor 88 to be smaller, thereby presenting a higher impedance between nodes 102 and 90. This causes power supply noise to be amplified in the operational amplifier at a higher frequency than would otherwise occur and improves the noise characteristics in the low frequency audio band which is the region of interest in most applications of MOS operational amplifiers.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. An operational amplifier circuit comprising:
a pair of power conductors adapted to be connected to two potential sources at different levels;
a bias means connected to said conductors;
a differential amplifier connected to said bias means and having an output node;
a level shift means comprising first and second MOS transistors, the gate of said first transistor being connected to said output node of said differential amplifier, and the gate of said second transistor being connected to said bias means, the drain of said first MOS transistor being connected to one of said pair of power conductors, the source of said first MOS transistor being connected to the drain of said second MOS transistor, and the source of said second MOS transistor being connected to the second of said pair of power conductors;
an output stage connected to said level shift means; and
frequency compensation means connected between said differential amplifier and said output stage for allowing the dominant pole of the circuit transfer function to be situated at a relatively high frequency that increases the gain bandwidth of the circuit, wherein said frequency compensation means comprises a first capacitor having a first and a second plate, said first plate of said first capacitor connected to said output node on said differential amplifier and said second plate of said first capacitor connected to a transmission gate connected to said output stage; and a second capacitor having a first and a second plate, said first plate of said second capacitor connected to said output node of said differential amplifier and said second plate of said second capacitor connected to said level shift means.

2. The operational amplifier circuit of claim 1 wherein said transmission gate is comprised of a pair of CMOS transistors connected between said pair of conductors.

3. The operational amplifier circuit of claim 1 wherein said second capacitor is connected between the gate and the source of said first level shift transistor for removing secondary poles in the transfer function.

* * * * *